United States Patent
Kishi et al.

(10) Patent No.: US 9,632,982 B2
(45) Date of Patent: Apr. 25, 2017

(54) ORTHOGONAL TRANSFORM APPARATUS, ORTHOGONAL TRANSFORM METHOD, ORTHOGONAL TRANSFORM COMPUTER PROGRAM, AND AUDIO DECODING APPARATUS

(71) Applicant: FUJITSU LIMITED, Kawasaki-shi, Kanagawa (JP)

(72) Inventors: Yohei Kishi, Kawasaki (JP); Akira Kamano, Kawasaki (JP); Shunsuke Takeuchi, Kawasaki (JP); Takeshi Otani, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 218 days.

(21) Appl. No.: 14/229,150

(22) Filed: Mar. 28, 2014

(65) Prior Publication Data

US 2014/0297706 A1 Oct. 2, 2014

(30) Foreign Application Priority Data

Mar. 28, 2013 (JP) .................................. 2013-070385

(51) Int. Cl.
*G06F 17/14* (2006.01)
*G10L 19/02* (2013.01)
(Continued)

(52) U.S. Cl.
CPC ........ *G06F 17/147* (2013.01); *G10L 19/0212* (2013.01); *H03H 17/0272* (2013.01);
(Continued)

(58) Field of Classification Search
None
See application file for complete search history.

(56) References Cited

U.S. PATENT DOCUMENTS

2013/0006618 A1\* 1/2013 Toguri ................ G10L 19/0212
704/204
2013/0182854 A1\* 7/2013 Kishi .................... G10L 19/008
381/23

(Continued)

FOREIGN PATENT DOCUMENTS

| JP | 4-007976 | 1/1992 |
| JP | 8-305684 | 11/1996 |

OTHER PUBLICATIONS

International Standard, Information technology—MPEG Audio Technologies. ISO/IEC 23003-1:2007(E). First edition, Feb. 15, 2007.

*Primary Examiner* — David H Malzahn
(74) *Attorney, Agent, or Firm* — Fujitsu Patent Center

(57) ABSTRACT

An orthogonal transform apparatus includes: an interchanging unit which interchanges MDCT coefficients contained in a first half of a prescribed interval with MDCT coefficients contained in a second half thereof; an inverting unit which inverts the sign of the MDCT coefficients contained in the second half of the prescribed interval after the interchange; an inverse cosine transform unit which computes the real components of QMF coefficients by applying an IMDCT using FFT to the MDCT coefficients contained in the first half and the sign-inverted MDCT coefficients contained in the second half; an inverse sine transform unit which computes the imaginary components of the QMF coefficients by applying an IMDST using FFT to the MDCT coefficients contained in the first half and the sign-inverted MDCT coefficients contained in the second half; and a coefficient adjusting unit which computes the QMF coefficients by combining the real components with the imaginary components.

3 Claims, 14 Drawing Sheets

(51) Int. Cl.
*H03H 17/02* (2006.01)
*H04N 19/60* (2014.01)
*H04N 19/635* (2014.01)
*H04N 19/625* (2014.01)

(52) U.S. Cl.
CPC ........... *H04N 19/60* (2014.11); *H04N 19/625* (2014.11); *H04N 19/635* (2014.11)

(56) References Cited

U.S. PATENT DOCUMENTS

2014/0294181 A1* 10/2014 Kamano ............... G06F 17/147
    381/22
2014/0297706 A1* 10/2014 Kishi .................... H04N 19/60
    708/300

* cited by examiner

FIG. 3

| idx | 0 | 1 | 2 | 3 | 4 | 5 | 6 | 7 |
|---|---|---|---|---|---|---|---|---|
| ICC[idx] | 1 | 0.937 | 0.84118 | 0.60092 | 0.36764 | 0 | -0.589 | -0.99 |

| idx | -20 | -19 | -18 | -17 | -16 | -15 | -14 | -13 | -12 | -11 | -10 |
|---|---|---|---|---|---|---|---|---|---|---|---|
| CPC[idx] | -2.0 | -1.9 | -1.8 | -1.7 | -1.6 | -1.5 | -1.4 | -1.3 | -1.2 | -1.1 | -1.0 |
| idx | -9 | -8 | -7 | -6 | -5 | -4 | -3 | -2 | -1 | 0 | 1 |
| CPC[idx] | -0.9 | -0.8 | -0.7 | -0.6 | -0.5 | -0.4 | -0.3 | -0.2 | -0.1 | 0.0 | 1.0 |
| idx | 2 | 3 | 4 | 5 | 6 | 7 | 8 | 9 | 10 | 11 | 12 |
| CPC[idx] | 0.2 | 0.3 | 0.4 | 0.5 | 0.6 | 0.7 | 0.8 | 0.9 | 1.0 | 1.1 | 1.2 |
| idx | 13 | 14 | 15 | 16 | 17 | 18 | 19 | 20 | 21 | 22 | 23 |
| CPC[idx] | 1.3 | 1.4 | 1.5 | 1.6 | 1.7 | 1.8 | 1.9 | 2.0 | 2.1 | 2.2 | 2.3 |
| idx | 24 | 25 | 26 | 27 | 28 | 29 | 30 | | | | |
| CPC[idx] | 2.4 | 2.5 | 2.6 | 2.7 | 2.8 | 2.9 | 3.0 | | | | |

ORTHOGONAL TRANSFORM APPARATUS, ORTHOGONAL TRANSFORM METHOD, ORTHOGONAL TRANSFORM COMPUTER PROGRAM, AND AUDIO DECODING APPARATUS

CROSS-REFERENCE TO RELATED APPLICATION

This application is based upon and claims the benefit of priority of the prior Japanese Patent Application No. 2013-070385, filed on Mar. 28, 2013, the entire contents of which are incorporated herein by reference.

FIELD

The embodiments discussed herein are related to an orthogonal transform apparatus, an orthogonal transform method, an orthogonal transform computer program, and an audio decoding apparatus using the same.

BACKGROUND

Various audio coding systems have been developed in the prior art for compressing the amount of data needed to represent a multichannel audio signal carrying three or more channels. One such known coding system is the MPEG Surround System standardized by the Moving Picture Experts Group (MPEG) (for example, refer to ISO/IEC 23003-1). In the MPEG Surround System, a plurality of channel signals are downmixed to generate spatial information and a main signal representing the main component of each original channel signal, and this main signal and the spatial information are encoded. Further, in this coding system, a residual signal representing a component orthogonal to the main signal is also computed, and this residual signal may also be encoded.

The main signal and the residual signal are each obtained by first transforming the downmix signal into a time domain signal and then transforming it into a frequency domain signal by a modified discrete cosine transform (MDCT). Of these two signals, the main signal once transformed into a time domain signal is further transformed into QMF coefficients representing a time-frequency domain signal by using a quadrature mirror filter (QMF), because upmixing is performed using the spatial information when decoding. Therefore, the residual signal in the frequency domain is also transformed into QMF coefficients in the time-frequency domain so that the residual signal can be used when upmixing.

SUMMARY

Since the orthogonal transforms such as MDCT and QMF are performed over and over again as described above to decode the audio signal encoded by the MPEG Surround System, the amount of computation becomes very large. The larger the amount of computation, the higher the computational capability necessary for an audio decoding apparatus, and the power consumption of the audio decoding apparatus correspondingly increases. There is a need to reduce the amount of computation needed to decode the audio signal encoded by the MPEG Surround System.

According to one embodiment, an orthogonal transform apparatus for transforming modified discrete cosine transform coefficients contained in a prescribed interval into quadrature mirror filter coefficients is provided. The orthogonal transform apparatus includes: an interchanging unit which interchanges the modified discrete cosine transform coefficients contained in a first half of the prescribed interval with the modified discrete cosine transform coefficients contained in a second half of the prescribed interval; an inverting unit which inverts the sign of the modified discrete cosine transform coefficients contained in the second half of the prescribed interval after the interchange; an inverse cosine transform unit which computes real components of the quadrature mirror filter coefficients by applying an inverse modified discrete cosine transform using a fast Fourier transform to the modified discrete cosine transform coefficients contained in the first half of the prescribed interval after the interchange and the sign-inverted modified discrete cosine transform coefficients contained in the second half of the prescribed interval after the interchange; an inverse sine transform unit which computes imaginary components of the quadrature mirror filter coefficients by applying an inverse modified discrete sine transform using a fast Fourier transform to the modified discrete cosine transform coefficients contained in the first half of the prescribed interval after the interchange and the sign-inverted modified discrete cosine transform coefficients contained in the second half of the prescribed interval after the interchange; and a coefficient adjusting unit which computes the quadrature mirror filter coefficients by combining the real components of the quadrature mirror filter coefficients with the imaginary components of the quadrature mirror filter coefficients.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating one example of a quantization table that provides a mapping of degrees of similarity.

FIG. 5 is a diagram illustrating one example of a quantization table that provides a mapping of prediction coefficients.

DESCRIPTION OF EMBODIMENTS

An orthogonal transform apparatus according to one embodiment will be described below with reference to the drawings. In the process for decoding the audio signal encoded by the MPEG Surround System, the process of transforming the frequency domain residual signal (MDCT coefficients) into the time-frequency domain signal (QMF coefficients) requires the largest amount of computation. For example, in the ISO reference decoder, the amount of computation involved in this transforming process accounts for about 70% of the total amount of computation of the decoding process. Accordingly, if the amount of computation needed to transform the MDCT coefficients into the QMF coefficients can be reduced, it becomes possible to reduce the amount of computation needed to decode the audio signal encoded by the MPEG Surround System.

In view of the above, the orthogonal transform apparatus of the embodiment aims to reduce the amount of computation needed to transform the MDCT coefficients into the QMF coefficients. More specifically, the orthogonal transform apparatus uses a fast Fourier transform (FFT) in order to enhance the speed of a butterfly inverse modified discrete cosine transform (IMDCT) and a butterfly inverse modified discrete sine transform (IMDST) that are used when transforming the MDCT coefficients into the QMF coefficients. In this case, the orthogonal transform apparatus prevents signal degradation by precompensating for the frame-length and phase differences that would arise between the conventional IMDCT and IMDST and the butterfly IMDCT and IMDST.

In the present embodiment, the multichannel audio signal to be decoded is a 5.1-channel audio signal. However, the multichannel audio signal to be decoded is not limited to a 5.1-channel audio signal, but may be, for example, a 7.1-channel audio signal.

Figure 1:
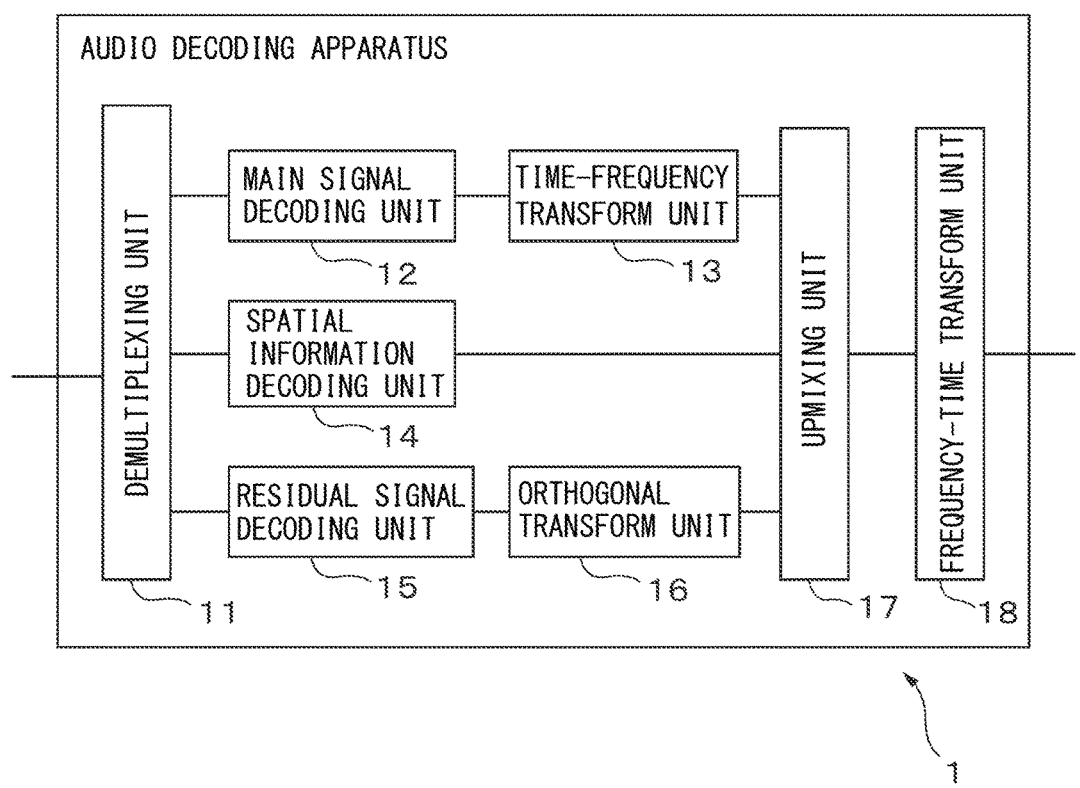
FIG. 1 is a diagram schematically illustrating the configuration of an audio decoding apparatus incorporating an orthogonal transform apparatus according to one embodiment.

FIG. 1 is a diagram schematically illustrating the configuration of an audio decoding apparatus 1 according to one embodiment. The audio decoding apparatus 1 includes a demultiplexing unit 11, a main signal decoding unit 12, a time-frequency transform unit 13, a spatial information decoding unit 14, a residual signal decoding unit 15, an orthogonal transform unit 16, an upmixing unit 17, and a frequency-time transform unit 18.

These units constituting the audio decoding apparatus 1 are each implemented as a separate circuit. Alternatively, these units constituting the audio decoding apparatus 1 may be implemented on the audio decoding apparatus 1 in the form of a single integrated circuit on which the circuits corresponding to the respective units are integrated. Alternatively, these units constituting the audio decoding apparatus 1 may be implemented as functional modules by executing a computer program on a processor contained in the audio decoding apparatus 1.

The demultiplexing unit 11 demultiplexes a main signal code, a spatial information code, and an encoded residual signal from a data stream containing the encoded audio signal in accordance with a data format carrying the encoded audio signal. The main signal code includes an Advanced Audio Coding (AAC) code and a Spectral Band Replication (SBR) code.

Figure 2:
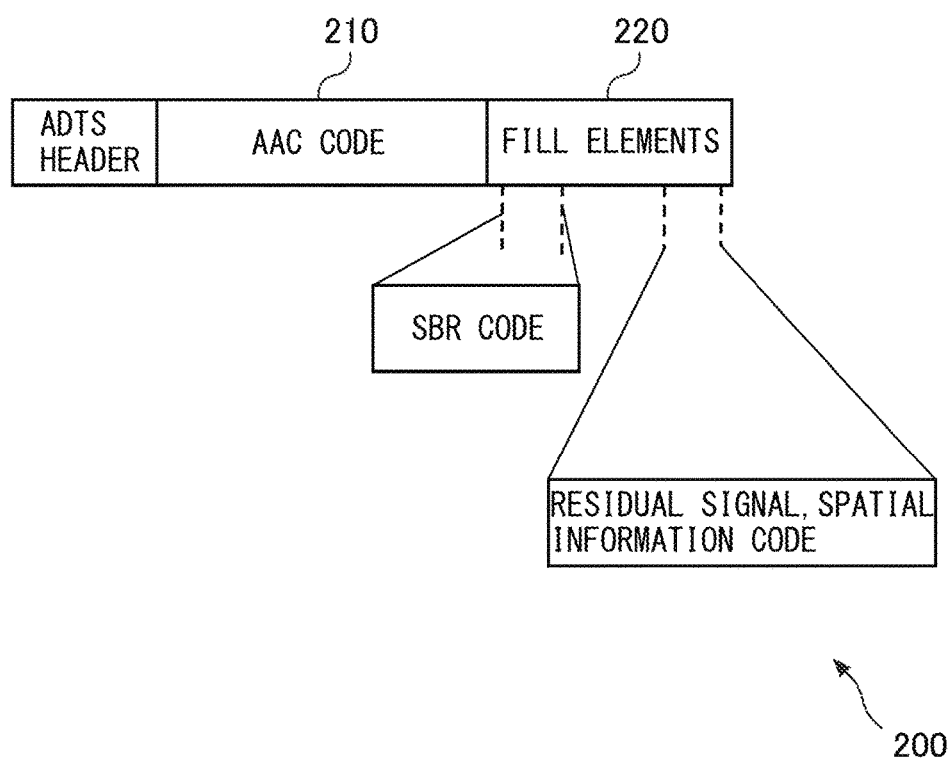
FIG. 2 is a diagram illustrating one example of a data format carrying an encoded audio signal.

FIG. 2 is a diagram illustrating one example of the data format carrying the encoded audio signal. In the illustrated example, the encoded audio signal is created in accordance with the MPEG-4 ADTS (Audio Data Transport Stream) format. In the encoded data sequence 200 depicted in FIG. 2, the AAC code is stored in a data block 210. The SBR code, the spatial information code, and the encoded residual signal are stored in designated areas within a data block 220 that stores FILL elements of the ADTS format.

The demultiplexing unit 11 passes the main signal code to the main signal decoding unit 12. Further, the demultiplexing unit 11 passes the spatial information code to the spatial information decoding unit 14 and the encoded residual signal to the residual signal decoding unit 15.

The main signal decoding unit 12 decodes the main signal code which is an encoded version of the main signal representing the main component of a stereo signal generated by downmixing the original multichannel audio signal. The main signal decoding unit 12 reconstructs low-frequency components for the left and right channels by decoding the AAC code in accordance with, for example, the AAC code decoding process described in the ISO/IEC 14496-3 specification. More specifically, the main signal decoding unit 12 reconstructs a quantized signal by entropy decoding the AAC code, and reconstructs the MDCT coefficients by inverse-quantizing the quantized signal. Then, the main signal decoding unit 12 reconstructs the low-frequency components for the left and right channels on a frame-by-frame basis by applying the IMDCT to the reconstructed MDCT coefficients.

Further, the main signal decoding unit 12 reconstructs high-frequency components for the left and right channels on a frame-by-frame basis by decoding the SBR code in accordance with, for example, the SBR code decoding process described in the ISO/IEC 14496-3 specification. Then, the main signal decoding unit 12 reconstructs the left and right channel signals of the stereo signal by combining the low-frequency components and high-frequency components on a channel-by-channel basis. The main signal decoding unit 12 passes the reconstructed stereo signal to the time-frequency transform unit 13.

The time-frequency transform unit 13 is one example of a quadrature mirror filtering unit, and transforms each of the time-domain channel signals of the reconstructed stereo signal into the QMF coefficients in the time-frequency domain on a frame-by-frame basis by using a QMF filter bank.

The QMF filter bank is expressed by the following equation.

$$QMF(k, n) = \exp\left[j\frac{\pi}{128}(k + 0.5)(2n + 1)\right], \quad (1)$$

$$0 \leq k < 64,$$

$$0 \leq n < 128$$

where n is a variable representing the time, and represents the nth time when the stereo signal of one frame is divided into 128 equal parts along its time direction. The frame length can be set to any value that falls within the range of 10 to 80 msec. On the other hand, k is a variable representing the frequency band, and represents the kth frequency band when the frequency band of the frequency signal is divided into 64 equal parts.

The time-frequency transform unit 13 passes the computed QMF coefficients to the upmixing unit 17.

The spatial information decoding unit 14 decodes the spatial information code received from the demultiplexing unit 11. The spatial information includes, for example, the degree of similarity ICC between two channels that represents the degree of sound spreading, and the intensity difference CLD between two channels that represents the degree of sound localization. The spatial information further includes a prediction coefficient CPC for predicting the center channel signal from the right and left channel signals. The degree of similarity ICC, the intensity difference CLD, and the prediction coefficient CPC are obtained on a frequency-by-frequency when downmixing the audio signal. The spatial information code includes a Huffman code for each of the degree of similarity ICC, the intensity difference CLD, and the prediction coefficient CPC.

The spatial information decoding unit 14 reconstructs an index difference value by referring to a table that provides a mapping between the index difference value, such as the degree of similarity ICC between adjacent frequencies, and the Huffman code. The spatial information decoding unit 14 reconstructs the index value for each frequency band by sequentially adding up the index differences on a frequency-band by frequency-band basis. Then, the spatial information decoding unit 14 determines the quantized value representing the degree of similarity ICC, the intensity difference CLD, or the prediction coefficient CPC corresponding to that index value, by referring to a table that provides a mapping between the index value and the quantized value representing the degree of similarity ICC, the intensity difference CLD, or the prediction coefficient CPC, respectively.

FIG. 3 is a diagram illustrating one example of a quantization table for the degree of similarity. In the quantization table 300 illustrated in FIG. 3, each entry in the upper row 310 carries the index value, and each entry in the lower row 320 carries the quantized value for the degree of similarity corresponding to the index value in the same column. The range of values that the degree of similarity can take is from −0.99 to +1. For example, when the index value of the frequency band k is 3, the spatial information decoding unit 14 refers to the quantization table 300 and determines that 0.60092 corresponding to the index value 3 is the quantized value of the degree of similarity.

Figure 4:
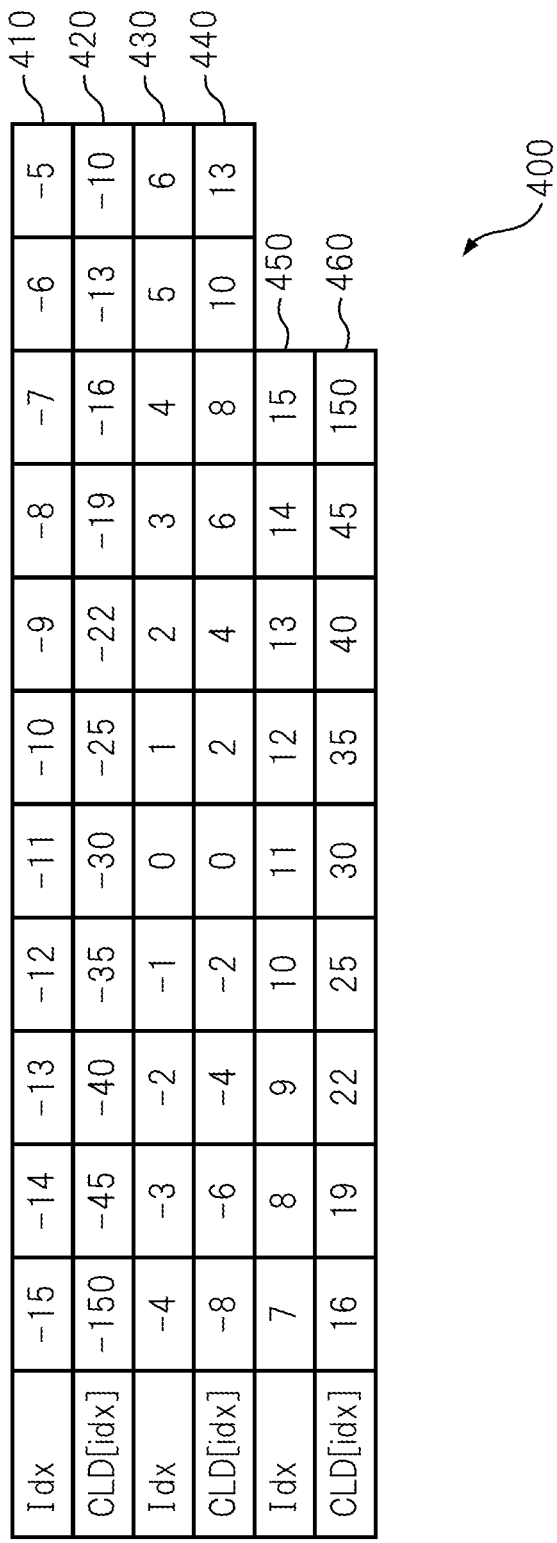
FIG. 4 is a diagram illustrating one example of a quantization table that provides a mapping of intensity differences.

FIG. 4 is a diagram illustrating one example of a quantization table for the intensity difference. In the quantization table 400 illustrated in FIG. 4, each entry in rows 410, 430, and 450 carries the index value, and each entry in rows 420, 440, and 460 carries the quantized value for the intensity difference corresponding to the index value in the same column in the corresponding one of the rows 410, 430, and 450. For example, when the index value of the frequency band k is 5, the spatial information decoding unit 14 refers to the quantization table 400 and determines that 10 corresponding to the index value 5 is the quantized value of the density difference.

FIG. 5 is a diagram illustrating one example of a quantization table for the prediction coefficient. In the quantization table 500 illustrated in FIG. 5, each entry in rows 510, 520, 530, 540, and 550 carries the index value, and each entry in rows 515, 525, 535, 545, and 555 carries the quantized value for the prediction coefficient corresponding to the index value in the same column in the corresponding one of the rows 510, 520, 530, 540, and 550. For example, when the index value of the frequency band k is 3, the spatial information decoding unit 14 refers to the quantization table 500 and determines that 0.3 corresponding to the index value 3 is the quantized value of the prediction coefficient. The spatial information decoding unit 14 passes the quantized values of the spatial information for each frequency band to the upmixing unit 17.

The residual signal decoding unit 15 decodes the encoded residual signal. The residual signal is a component orthogonal to the main signal. In the MPEG Surround System, since the residual signal is also AAC encoded, MDCT is applied to the residual signal when encoding it. Accordingly, the residual signal decoding unit 15 reconstructs the residual signal represented by the MDCT coefficients, by decoding the residual signal in accordance with, for example, the AAC code decoding method described in the ISO/IEC 13818-7 specification. The MDCT coefficients are supplied to the orthogonal transform unit 16.

The orthogonal transform unit 16 is one example of the orthogonal transform apparatus, and transforms the residual signal represented by the MDCT coefficients as frequency domain signals into the QMF coefficients as time-frequency domain signals. The details of the orthogonal transform unit 16 will be described later.

The upmixing unit 17 reconstructs the QMF coefficients for each channel of the 5.1-channel audio signal by upmixing, based on the spatial information, the QMF coefficients of the left and right channels of the stereo signal and the QMF coefficients of the residual signal for each frequency band. For this purpose, the upmixing unit 17 may use the upmix technique specified, for example, in the ISO/IEC 23003-1 specification. For example, by upmixing the QMF coefficients of the left and right channels of the stereo signal and the QMF coefficients of the residual signal by using the spatial information, the upmixing unit 17 reconstructs the QMF coefficients for three channels, i.e., the left, right, and center channels. Further, by upmixing the reconstructed left channel QMF coefficients by using the spatial information computed when downmixing the front-left channel and the rear-left channel, the upmixing unit 17 reconstructs the QMF coefficients for the front-left channel and the rear-left channel. Similarly, by upmixing the reconstructed right channel QMF coefficients by using the spatial information computed when downmixing the front-right channel and the rear-right channel, the upmixing unit 17 reconstructs the QMF coefficients for the front-right channel and the rear-right channel. Further, by upmixing the reconstructed center channel QMF coefficients by using the spatial information computed when downmixing the center channel and the bass channel, the upmixing unit 17 reconstructs the QMF coefficients for the center channel and the bass channel.

The upmixing unit 17 passes the QMF coefficients reconstructed for each channel to the frequency-time transform unit 18.

The frequency-time transform unit 18 is one example of an inverse quadrature mirror filtering unit, and reconstructs the 5.1-channel audio signal by processing the QMF coefficients of each channel by reversing the QMF filter bank process performed by the time-frequency transform unit 13. The frequency-time transform unit 18 outputs the reconstructed audio signal, for example, to a speaker.

Figure 6:
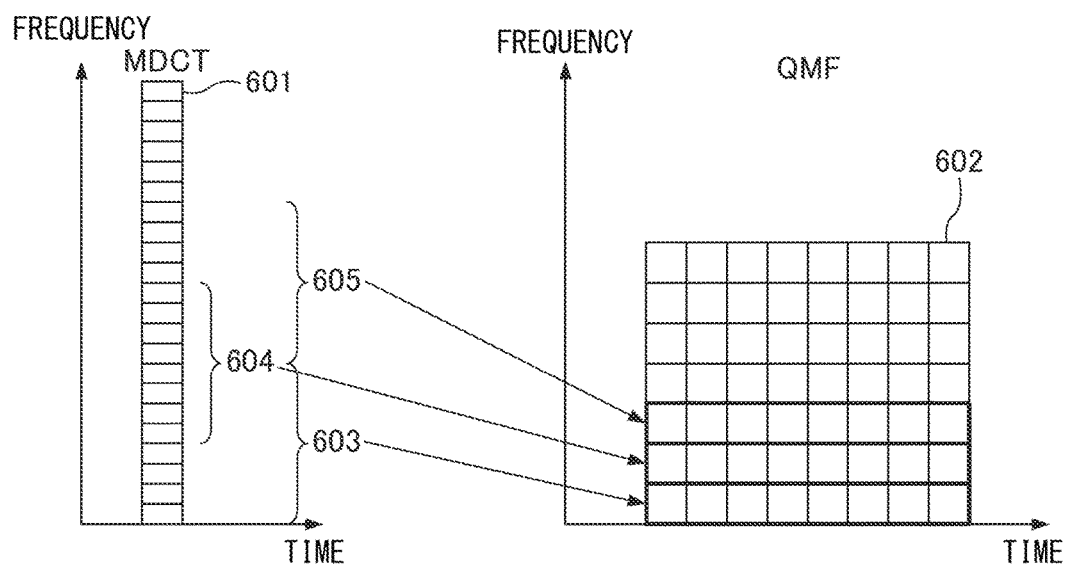
FIG. 6 is a conceptual diagram for explaining how MDCT coefficients are transformed into QMF coefficients.

The orthogonal transform unit 16 will be described in detail below. FIG. 6 is a conceptual diagram for explaining how the MDCT coefficients are transformed into the QMF coefficients. The array of MDCT coefficients is constructed from a plurality of coefficients arrayed only in the direction of the frequency axis. On the other hand, the array of QMF coefficients is constructed from a plurality of coefficients arrayed in the direction of the time axis as well as in the direction of the frequency axis. When the conventional IMDCT is applied to a frequency band containing a number, N, of successive MDCT coefficients, a number, 2N, of signals arranged along the direction of the time axis can be obtained for that frequency band. Therefore, by dividing the whole array of the MDCT coefficients into a plurality of frequency bands and by performing the IMDCT for each frequency band, a plurality of coefficients arranged along the direction of the time axis, like the QMF coefficients, can be obtained for each frequency band. However, in this case, aliasing distortions occur between frequency bands.

In view of the above, when transforming the MDCT coefficients into the QMF coefficients, the entire array of the MDCT coefficients is divided into a plurality of frequency bands, each overlapping with an adjacent frequency band by one half of the frequency band, such as the frequency bands 603 to 605, in accordance with the ISO/IEC 23003-1 specification. In this case, each frequency band has a length twice that of the frequency band to which the conventional IMDCT is applied, and contains, for example, a number, 2N, of successive MDCT coefficients. Then, by applying the butterfly IMDCT and IMDST to each such frequency band, the aliasing distortions occurring between the frequency bands cancel out each other, and a number, 2N, of QMF coefficients arranged along the direction of the time axis can be obtained for each frequency band. However, the amount of computation involved in the butterfly IMDCT and IMDST is very large. In view of this, the orthogonal transform unit 16 according to the present embodiment uses FFT in order to reduce the amount of computation involved in the butterfly IMDCT and IMDST.

Figure 7:
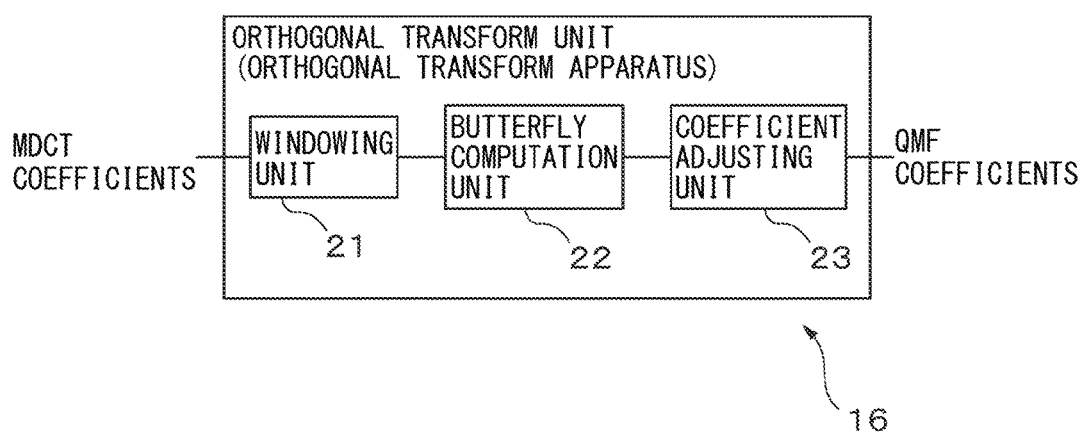
FIG. 7 is a block diagram of an orthogonal transform unit.

FIG. 7 is a block diagram of the orthogonal transform unit 16. The orthogonal transform unit 16 includes a windowing unit 21, a butterfly computation unit 22, and a coefficient adjusting unit 23.

The windowing unit 21 multiplies the MDCT coefficients of the residual signal by a windowing function for the butterfly IMDCT and butterfly IMDST and a gain $(1/2N)^{1/2}$. In the present embodiment, the windowing function $w_f[n]$ is expressed by the following equation.

$$w_f[n] = \sum_{m=-319}^{319} h_{norm}[320 + m] \cos\left\{\frac{\pi(2n + 1 + oddflag - 2N)m}{128N}\right\} \quad (2)$$

$$h[n] = \begin{cases} h_{qmf}[n] & \text{if } 0 \le n \le 127 \\ -h_{qmf}[n] & \text{if } 128 \le n \le 255 \\ h_{qmf}[n] & \text{if } 256 \le n \le 383 \\ -h_{qmf}[n] & \text{if } 384 \le n \le 511 \\ h_{qmf}[n] & \text{if } 512 \le n \le 639 \end{cases}$$

$$h_{norm}[n] = \frac{h[n]}{\sum_{n=0}^{639} h[n]}$$

$$oddflag = \begin{cases} 1 & \text{if } N/2 \text{ is odd;} \\ 0 & \text{if } N/2 \text{ is even.} \end{cases}$$

where (2N) represents the number of MDCT coefficients contained in the frequency band f to which the butterfly IMDCT and butterfly IMDST are applied. On the other hand, n represents the order of the coefficient on the time axis obtained as a result of the butterfly IMDCT and butterfly IMDST. The windowing unit 21 passes the MDCT coefficients of the residual signal multiplied by the windowing function and the gain to the butterfly computation unit 22.

Figure 8:
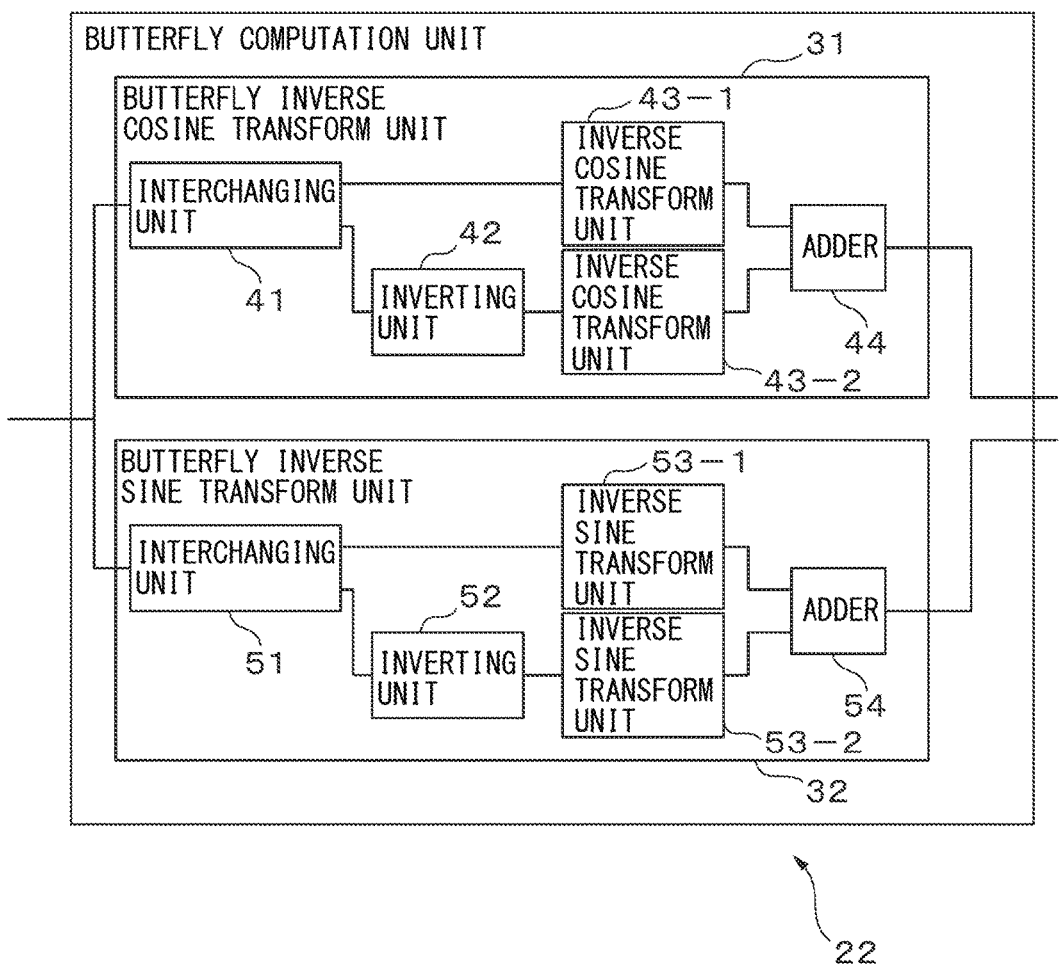
FIG. 8 is a block diagram of a butterfly computation unit.

FIG. 8 is a block diagram of the butterfly computation unit 22. The butterfly computation unit 22 includes a butterfly inverse cosine transform unit 31 which applies the butterfly IMDCT to the MDCT coefficients of the residual signal multiplied by the windowing function and the gain, and a butterfly inverse sine transform unit 32 which applies the butterfly IMDST to the MDCT coefficients. In the present embodiment, to reduce the amount of computation, the butterfly inverse cosine transform unit 31 and the butterfly inverse sine transform unit 32 employ the method of performing the IMDCT and IMDST using FFT, rather than directly implementing the butterfly IMDCT and butterfly IMDST.

There are differences such as described below between the butterfly IMDCT and butterfly IMDST and the conventional IMDCT and conventional IMDST. Generally, the butterfly IMDCT is expressed by the following equation.

$$ButterflyIMDCT[n] = \sqrt{\frac{1}{2N}} w[n] \sum_{k=0}^{2N-1} x[k] \cdot \cos\left(\frac{\pi}{N}(n + n_0)\left(k - N + \frac{1}{2}\right)\right) \quad (3)$$

$$0 \le n < 2N$$

On the other hand, the conventional IMDCT is expressed by the following equation.

$$IMDCT[n] = \sqrt{\frac{2}{N}} w[n] \sum_{k=0}^{N-1} x[k] \cdot \cos\left(\frac{\pi}{N}(n + n_0)\left(k + \frac{1}{2}\right)\right) \quad (4)$$

$$0 \le n < 2N$$

where x[k] (k=0, 1, 2, ..., 2N−1) are MDCT coefficients. As is apparent from the above equations (3) and (4), in the butterfly IMDCT, the number of MDCT coefficients per computation interval is twice that in the conventional IMDCT. Further, the cosine basis functions differ in phase by $(n+n_0)\pi$. Similarly, the number of MDCT coefficients per computation interval and the phase of the sine basis functions differ between the butterfly IMDST and the conventional IMDST. As a result, if the method that uses FFT in the conventional IMDCT and IMDST were directly applied to the butterfly IMDCT and IMDST, the reconstructed original signal (in the present embodiment, the residual signal) would contain artifact signal components, resulting in a degradation of the original signal. In view of this, the butterfly inverse cosine transform unit 31 and the butterfly inverse sine transform unit 32 each reorder the MDCT coefficients and invert their signs so that the number of MDCT coefficients per computation interval and the phase of the basis function match the number of coefficients and the phase of the basis function in the conventional IMDCT or IMDST.

Figure 9:
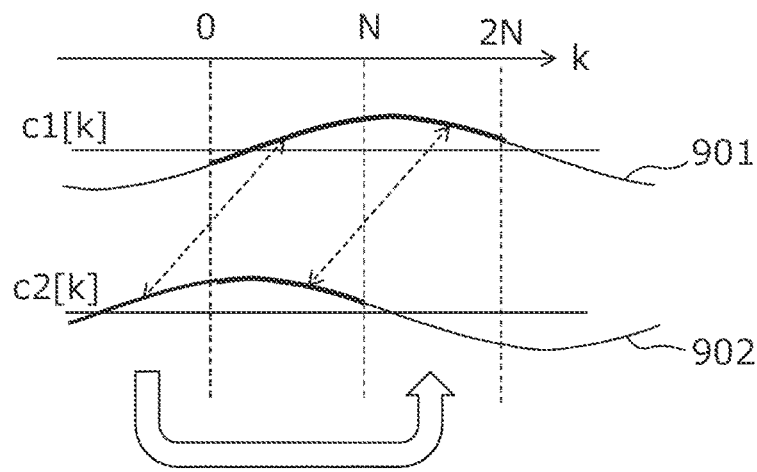
FIG. 9 is a diagram illustrating the relationship between the cosine basis function of a butterfly IMDCT and the cosine basis function of a conventional IMDCT.

Referring to FIG. 9, a description will be given of the relationship between the cosine basis function of the butterfly IMDCT and the cosine basis function of the conventional IMDCT. In FIG. 9, the abscissa represents the frequency k of the MDCT coefficient. Graph 901 represents the cosine basis function c1[k] of the conventional IMDCT, while graph 902 represents the cosine basis function c2[k] of the butterfly IMDCT. Since the functions c1[k] and c2[k] respectively correspond to the trigonometric function terms in the above equations (3) and (4), these functions are respectively expressed by the following equations.

$$c1[k] = \cos\left(\frac{\pi}{N}(n+n_0)\left(k+\frac{1}{2}\right)\right) \quad (5)$$

$$c2[k] = \cos\left(\frac{\pi}{N}(n+n_0)\left(k-N+\frac{1}{2}\right)\right) \quad (6)$$

It can be seen from FIG. 9 and the equations (5) and (6) that, between the functions c1[k] and c2[k], the value of k is shifted in phase by N. This means that the value of the cosine basis function c2[k] of the butterfly IMDCT on the interval [0, N−1] is equal to the value of the cosine basis function c1[k] of the conventional IMDCT on the interval [N, 2N−1].

Further, the cosine basis functions c1[k] and c2[k] are equal in absolute value but opposite in sign to the values c1[k−2N] and c2[k−2N] of the respective functions when the value of k differs by 2N. That is, the following relation holds between the cosine basis functions c1[k] and c2[k].

$$c1[k]=c2[k+N] \quad 0 \le k < N$$

$$c1[k]=-c2[k-N] \quad N \le k < 2N \quad (7)$$

Hence, the following equation holds.

$$ButterflyIMDCT'[n] = \sum_{k=0}^{2N-1} x[k] \cdot c2[k] \quad 0 \le n < 2N \quad (8)$$

$$= \sum_{k=0}^{N-1} x[k] \cdot c2[k] + \sum_{k=N}^{2N-1} x[k] \cdot c2[k]$$

$$= \sum_{k=0}^{N-1} x[k+N] \cdot c1[k] + \sum_{k=N}^{2N-1} -x[k-N] \cdot c1[k]$$

As can be seen from the equation (8), if the MDCT coefficients x[k] (k=0, 1, . . . , N−1) in the first half of the interval are interchanged with the MDCT coefficients x[k] (k=N, N+1, . . . , 2N−1) in the second half, it becomes possible to apply the cosine basis function c1[k] of the conventional IMDCT to the first half after the interchange. On the other hand, for the MDCT coefficients contained in the second half after the interchange, if their signs are inverted, it is possible to apply the cosine basis function c1[k] of the conventional IMDCT. The first and second halves of the interval are each equal in length to the interval to which the conventional IMDCT is applied. Accordingly, the conventional IMDCT can be applied to each of the first and second halves.

A similar relation holds between the sine basis function of the butterfly IMDST and the sine basis function of the conventional IMDST. Accordingly, for the butterfly IMDST also, if the MDCT coefficients in the first half of the computation interval are interchanged with the MDCT coefficients in the second half, and if the sign of the MDCT coefficients contained in the first half after the interchange is inverted, it is possible to apply the conventional IMDST to each of the first and second halves.

In view of the above, the butterfly inverse cosine transform unit 31 computes the real components of the QMF coefficients by performing the conventional IMDCT using FFT after performing processing such as reordering the MDCT coefficients within the computation interval, rather than directly implementing the butterfly IMDCT. Referring back to FIG. 8, the butterfly inverse cosine transform unit 31 includes an interchanging unit 41, an inverting unit 42, inverse cosine transform units 43-1 and 43-2, and an adder 44. Similarly, the butterfly inverse sine transform unit 32 computes the imaginary components of the QMF coefficients by performing the conventional IMDST using FFT after performing processing such as reordering the MDCT coefficients within the computation interval. For this purpose, the butterfly inverse sine transform unit 32 includes an interchanging unit 51, an inverting unit 52, inverse sine transform units 53-1 and 53-2, and an adder 54.

The following description deals only with the butterfly inverse cosine transform unit 31. By simply changing the basis functions used for the transform from the cosine functions to the sine functions, the butterfly inverse sine transform unit 32 can accomplish the butterfly IMDST by applying the conventional IMDST using FFT to the MDCT coefficients in a manner similar to the butterfly inverse cosine transform unit 31.

Figure 10:
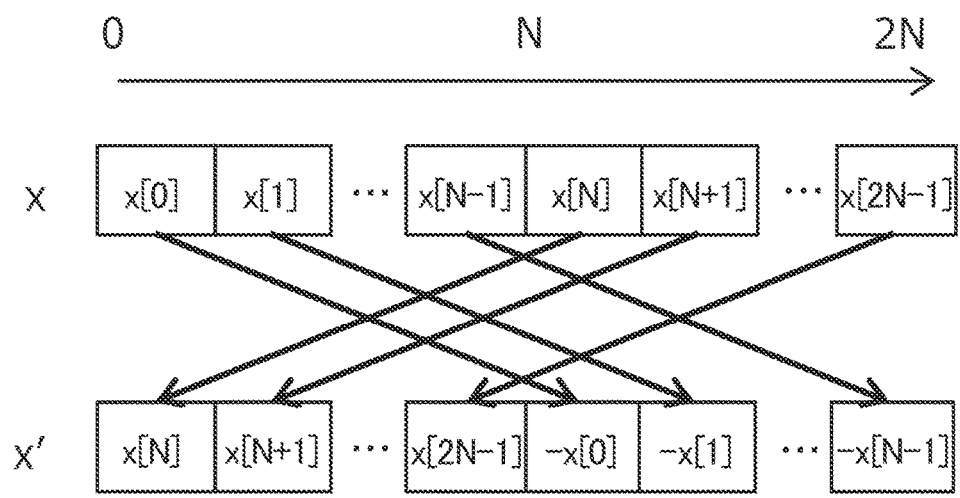
FIG. 10 is a diagram for explaining how the MDCT coefficients are reordered within a butterfly computation interval.

The processing performed by the interchanging unit 41 will be described with reference to FIG. 10. The interchanging unit 41 reorders the MDCT coefficients x[k], each multiplied by the windowing function and the gain, by interchanging the order of the first half and the second half, as indicated by arrows in FIG. 10, and thereby obtains the MDCT coefficients x'[k] after the interchange. The process of interchanging is expressed by the following equation.

$$x'[k]=x[k+N] \quad 0 \le k \le N$$

$$x'[k]=x[k-N] \quad N \le k < 2N \quad (9)$$

The interchanging unit 41 passes the MDCT coefficients x'[k] contained in the first half after the interchange, i.e., the MDCT coefficients initially contained in the second half, to the inverse cosine transform unit 43-1. At the same time, the interchanging unit 41 passes the MDCT coefficients x'[k] contained in the second half after the interchange, i.e., the MDCT coefficients initially contained in the first half, to the inverting unit 42.

The inverting unit 42 inverts the sign of the MDCT coefficients x'[k] contained in the second half after the interchange. The inverting unit 42 passes the MDCT coefficients x'[k] inverted in sign to the inverse cosine transform unit 43-2.

The inverse cosine transform unit 43-1 performs the IMDCT corresponding to the first term on the right-hand side of the equation (8) by using FFT. On the other hand, the inverse cosine transform unit 43-2 performs the IMDCT corresponding to the second term on the right-hand side of the equation (8) by using FFT. To reduce the amount of computation by performing the IMDCT or IMDST using FFT, use may be made of a technique disclosed, for example, in "Regular FFT-Related Transform Kernels for DCT/DST-Based Polyphase Filter Banks" by Rolf Gluth, IEEE Acoustics, Speech, and Signal Processing, ICASSP-91, 1991, vol. 3, pp. 2205-2208. Since the only difference between the inverse cosine transform units 43-1 and 43-2 is the data to be processed, the following description deals only with the inverse cosine transform unit 43-1.

Figure 11:
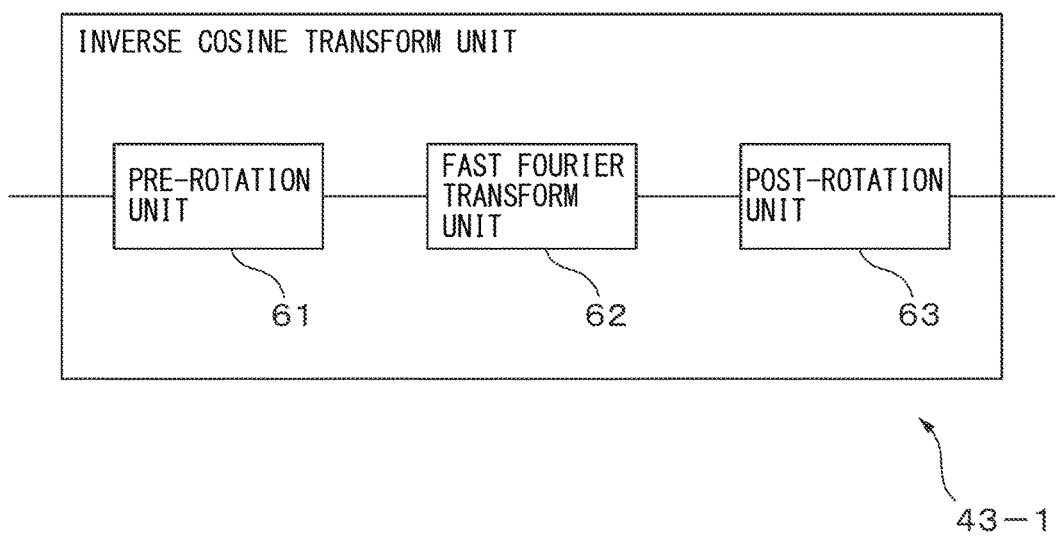
FIG. 11 is a block diagram of an inverse cosine transform unit.

FIG. 11 is a block diagram of the inverse cosine transform unit 43-1. To implement the technique disclosed in the above literature, the inverse cosine transform unit 43-1 includes a pre-rotation unit 61, a fast Fourier transform unit 62, and a post-rotation unit 63.

To narrow the range of computation by exploiting the symmetry of the trigonometric basis functions, the pre-rotation unit 61 obtains a composite function f[k] by compositing the input MDCT coefficients x'[k] in four groups in accordance with the following equation.

$$f[k]=(x[2k]+x[2N-2k-1])-j(x[N+2k]+x[N-2k-1])$$
$$(0\le k<N/2) \quad (10)$$

Then, the pre-rotation unit 61 rotates the composite function f[k] in the complex plane by one-eighth of a revolution in accordance with the following equation.

$$f'[k] = \beta_{twiddle} \cdot f[k] \quad (11)$$
$$\beta_{twiddle} = \exp\left(-j\frac{\pi}{N}\left(k+\frac{1}{8}\right)\right)$$

The pre-rotation unit 61 passes the rotated composite function f'[k] to the fast Fourier transform unit 62.

The fast Fourier transform unit 62 performs the FFT of the composite function f'[k]. The fast Fourier transform unit 62 can apply any of various computational methods known as FFT. The fast Fourier transform unit 62 passes the coefficients F[n] obtained by the FFT to the post-rotation unit 63.

The post-rotation unit 63 computes coefficients F'[n] in accordance with the following equation by rotating the coefficients F[n] by one-eighth of a revolution in the direction opposite to the direction of the rotation applied by the pre-rotation unit 61.

$$F'[n] = -\beta_{twiddle} \cdot F[n] \quad (12)$$
$$\beta_{twiddle} = \exp\left(-j\frac{\pi}{N}\left(k+\frac{1}{8}\right)\right)$$

The post-rotation unit 63 transforms the coefficients F'[n] in the complex plane into the coefficients Fu[n] in the real plane in accordance with the following equation.

$$F''[2n]=Re(F'[n])$$
$$F''[N-1-2n]=-Im(F'[n])(0\le n<N/2)$$
$$F''[N+2n]=Im(F'[n])$$
$$F''[2N-1-2n]=-Re(F'[n]) \quad (13)$$

where the function Re(x) is a function that outputs the real component of the variable x, and the function Im(x) is a function that outputs the imaginary component of the variable x. By multiplying the coefficients F''[n] by a windowing function for the conventional IMDCT, for example, a Kaiser-Bessel window, and a gain $(1/N)^{1/2}$, the post-rotation unit 63 obtains coefficients equivalent to the coefficients obtained by applying the IMDCT to the MDCT coefficients x'[k].

The adder 44 adds the coefficients output from the inverse cosine transform unit 43-1 to the corresponding coefficients output from the inverse cosine transform unit 43-2. This completes the calculation of the right-hand side of the equation (8), completing the butterfly IMDCT of the MDCT coefficients, and the real components of the QMF coefficients are obtained. The adder 44 passes the real components of the QMF coefficients to the coefficient adjusting unit 23.

The coefficient adjusting unit 23 obtains the QMF coefficients of the residual signal by combining the outputs of the butterfly computation unit 22, i.e., by combining the real components of the QMF coefficients obtained by the butterfly IMDCT of the MDCT coefficients with the imaginary components of the corresponding QMF coefficients obtained by the butterfly IMDST of the MDCT coefficients. More specifically, the coefficient adjusting unit 23 computes each QMF coefficient in accordance with the following equation.

$$z[n, f] = \{X[n, f] + jY[n, f]\} \quad (14)$$
$$Z = \left[\exp\left(-\frac{j\pi}{256}(258 \cdot 0 + 385)\right)z[n, 1]\right.$$
$$\exp\left(-\frac{j\pi}{256}(258 \cdot 1 + 385)\right)z[n, 2] \ldots$$
$$\left.\exp\left(-\frac{j\pi}{256}(258 \cdot (f-1) + 385)\right)z[n, f]\right]$$

where X[n,f] is the real component of the QMF coefficient obtained by the butterfly IMDCT of the MDCT coefficient, and Y[n,f] is the imaginary component of the QMF coefficient obtained by the butterfly IMDST of the MDCT coefficient. Z[n,f] is the resulting QMF coefficient. f denotes the frequency band to which the butterfly IMDCT and butterfly IMDST are applied.

Figure 12:
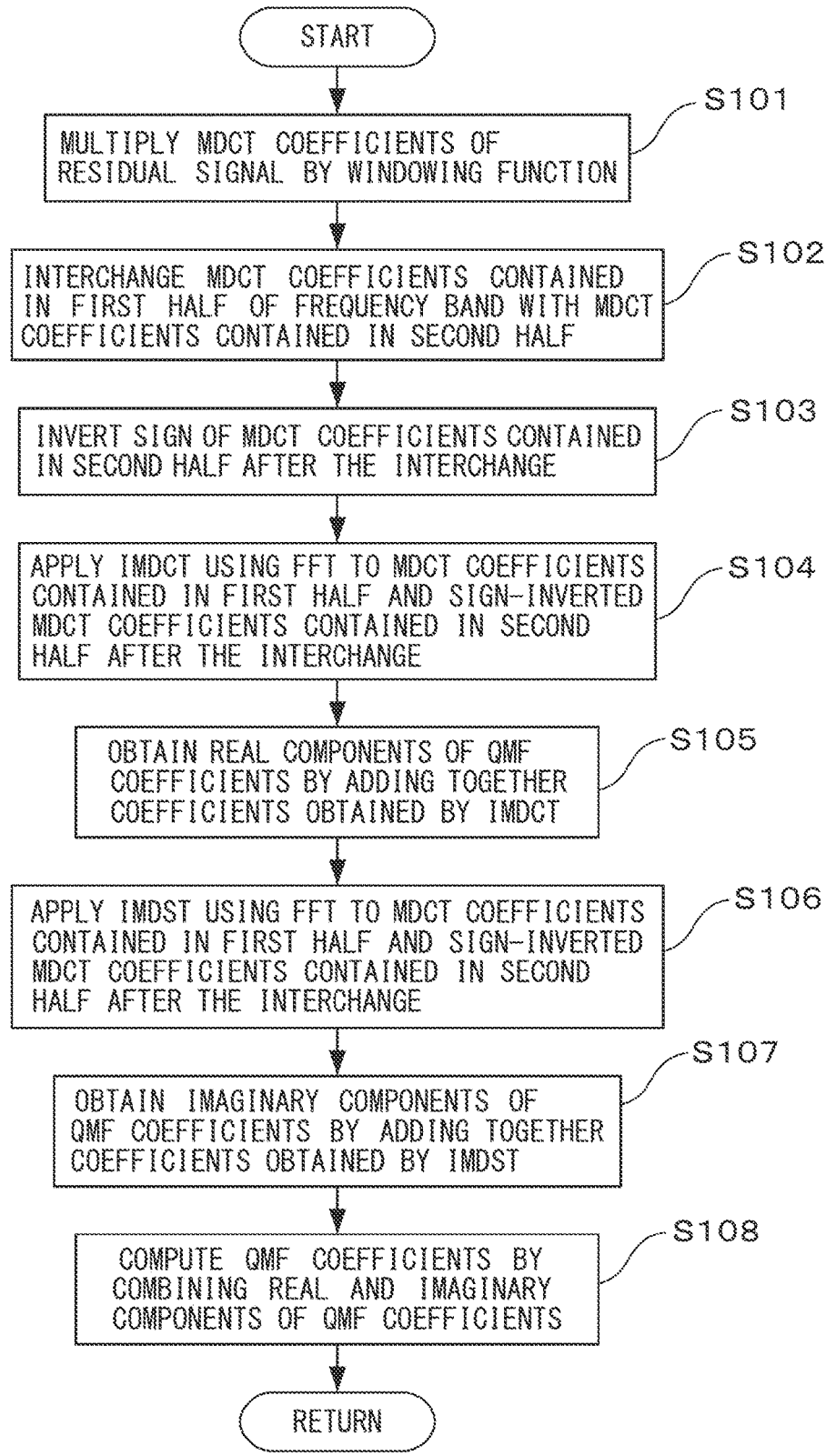
FIG. 12 is an operation flowchart of an orthogonal transform process.

FIG. 12 is an operation flowchart illustrating the orthogonal transform process performed by the orthogonal transform unit 16. The orthogonal transform unit 16 performs the orthogonal transform process in accordance with the following flowchart for each computation interval corresponding to one frequency band.

The windowing unit 21 in the orthogonal transform unit 16 multiplies the MDCT coefficients of the residual signal by the windowing function and the gain (step S101). Then, the windowing unit 21 passes the MDCT coefficients, each multiplied by the windowing function and the gain, to the butterfly computation unit 22 in the orthogonal transform unit 16.

The interchanging unit 41, 51 in the butterfly computation unit 22 interchanges the MDCT coefficients contained in the first half of the computation interval with the MDCT coefficients contained in the second half of the computation interval (step S102). The inverting units 42 and 52 in the butterfly computation unit 22 invert the sign of the MDCT coefficients contained in the second half of the computation interval after the interchange (step S103).

The inverse cosine transform units 43-1 and 43-2 in the butterfly computation unit 22 apply the IMDCT using FFT to the MDCT coefficients contained in the first half of the computation interval after the interchange and the sign-inverted MDCT coefficients contained in the second half of the computation interval after the interchange, respectively (step S104). Then, the adder 44 in the butterfly computation unit 22 adds together the coefficients obtained by the IMDCT and thereby obtains the real components of the QMF coefficients (step S105).

On the other hand, the inverse sine transform units 53-1 and 53-2 in the butterfly computation unit 22 apply the IMDST using FFT to the MDCT coefficients contained in the first half of the computation interval after the interchange and the sign-inverted MDCT coefficients contained in the second half of the computation interval, respectively (step S106). Then, the adder 54 in the butterfly computation unit 22 adds together the coefficients obtained by the IMDST and thereby obtains the imaginary components of the QMF coefficients (step S107).

The coefficient adjusting unit 23 in the orthogonal transform unit 16 obtains the QMF coefficients by combining the real and imaginary components of the QMF coefficients (step S108). Then, the orthogonal transform unit 16 terminates the orthogonal transform process.

The following table indicates the amount of computation per butterfly IMDCT according to the present embodiment when the number of MDCT coefficients contained in one computation interval is (2N).

TABLE 1

AMOUNT OF COMPUTATION PER BUTTERFLY IMDCT ACCORDING TO PRESENT EMBODIMENT

| PROCESSING | NUMBER OF MULTIPLICATIONS | NUMBER OF ADDITIONS | TOTAL |
|---|---|---|---|
| EXTRACTION (SHIFTING) | 0 | 0 | 0 |
| SIGN INVERSION | N | 0 | N |
| PRE-ROTATION | 2N | 2N | 4N |
| FFT | $(N/2)\log(N/4) - (7/4)N + 12$ | $(3N/4)\log(N/4) - (3/4)N + 4$ | $(5N/4)\log(N/4) - (5/2)N + 16$ |
| POST-ROTATION | 2N | N | 3N |
| TOTAL | — | — | $N + (5N/4)\log(N/4) + (9/2)N + 16$ |

As seen in the table, the amount of computation per butterfly IMDCT according to the present embodiment is of the order of NlogN which is equivalent to the amount of computation of the FFT. On the other hand, when the butterfly IMDCT is performed without using the FFT, as is usually the case, the amount of computation per butterfly IMDCT increases to $(8N^2)$. Accordingly, when N=32, for example, the amount of computation per butterfly IMDCT in the usual case is 8192 in terms of the number of computations, while the amount of computation per butterfly IMDCT according to the present embodiment is 312, and it can be seen that the amount of computation can be drastically reduced.

Figure 13:
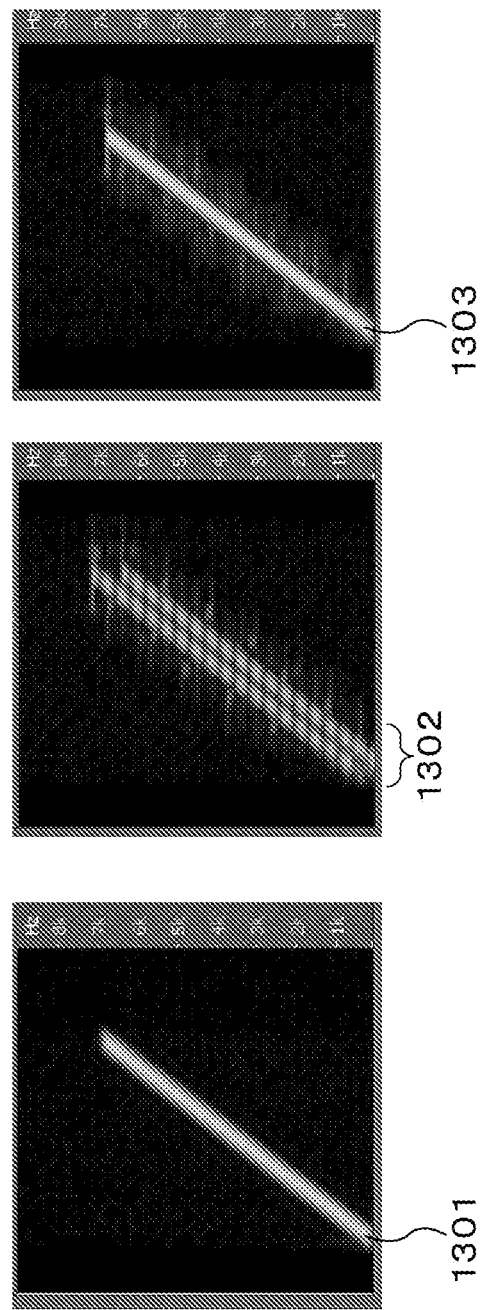
FIG. 13 is a diagram illustrating the spectrum of the audio signal reconstructed according to the present embodiment for comparison with the spectrum of the audio signal reconstructed when the butterfly IMDCT and butterfly IMDST are performed using FFT without reordering the MDCT coefficients and without inverting their signs.

FIG. 13 is a diagram illustrating the spectrum of the audio signal reconstructed according to the present embodiment for comparison with the spectrum of the audio signal reconstructed when the butterfly IMDCT and butterfly IMDST are performed using FFT without reordering the MDCT coefficients and without inverting their signs. In FIG. 13, the spectrum 1301 is the spectrum of the original sound. The spectrum 1302 is the spectrum of the audio signal reconstructed when the butterfly IMDCT and butterfly IMDST are performed using FFT without reordering the MDCT coefficients and without inverting their signs. On the other hand, the spectrum 1303 is the spectrum of the audio signal reconstructed according to the present embodiment.

It can be seen that, when the butterfly IMDCT and butterfly IMDST are performed using FFT without reordering the MDCT coefficients and without inverting their signs, the reconstructed spectrum is blurred compared with the spectrum of the original sound, thus degrading the sound quality. By contrast, in the present embodiment, the reconstructed spectrum is not blurred but is almost as clearly defined as the spectrum of the original sound, which indicates that the sound quality is retained.

Figure 14:
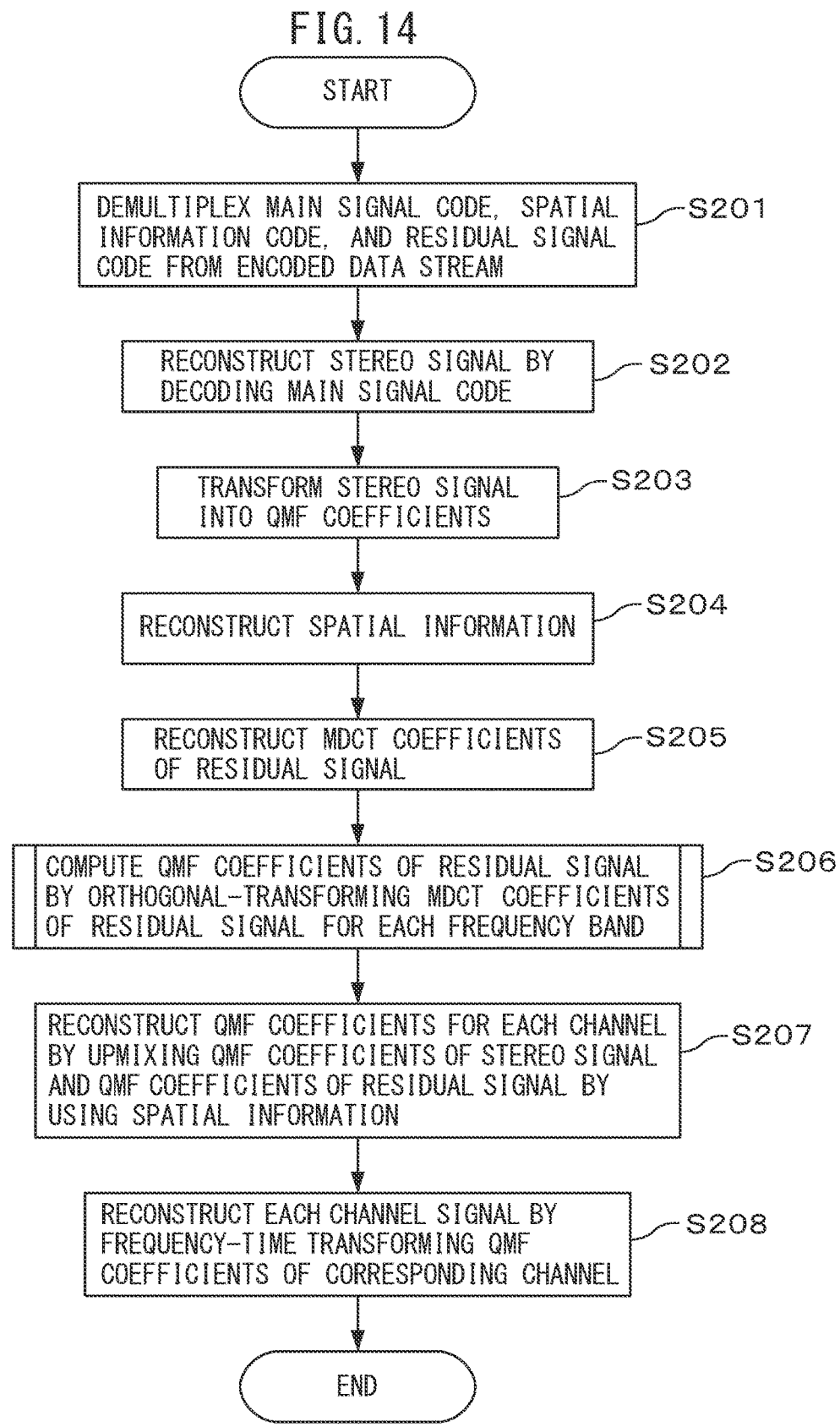
FIG. 14 is an operation flowchart of an audio decoding process which is performed by the audio decoding apparatus.

FIG. 14 is an operation flowchart of the audio decoding process performed by the audio decoding apparatus 1. The audio decoding apparatus 1 decodes the audio signal on a frame-by-frame basis in accordance with the following flowchart.

The demultiplexing unit 11 demultiplexes the main signal code such as the AAC code and SBR code, the spatial information code, and the residual signal code from the encoded data stream (step S201). The main signal decoding unit 12 reconstructs the stereo signal by decoding the main signal code received from the demultiplexing unit 11 (step S202). The time-frequency transform unit 13 transforms the stereo signal into QMF coefficients in the time-frequency domain by applying a QMF filter bank (sep S203).

On the other hand, the spatial information decoding unit 14 reconstructs the spatial information by decoding the spatial information code received from the demultiplexing unit 11 (step S204). The spatial information decoding unit 14 passes the reconstructed spatial information to the upmixing unit 17.

The residual signal decoding unit 15 reconstructs the MDCT coefficients of the residual signal by decoding the residual signal code received from the demultiplexing unit 11 (step S205). The orthogonal transform unit 16 computes the QMF coefficients of the residual signal by applying the butterfly IMDCT and butterfly IMDST using FFT to the MDCT coefficients of the residual signal (step S206).

The upmixing unit 17 reconstructs the QMF coefficients for each channel of the original audio signal by upmixing the QMF coefficients of the stereo signal and the QMF coefficients of the residual signal by using the spatial information (step S207). The frequency-time transform unit 18 reconstructs each channel of the audio signal by frequency-time transforming the QMF coefficients of the corresponding channel (step S208). Then, the audio decoding apparatus terminates the audio decoding process.

As has been described above, the orthogonal transform apparatus according to the present embodiment can reduce the amount of computation of the butterfly IMDCT and butterfly IMDST used to transform the MDCT coefficients into the QMF coefficients, by adjusting the codes and the order of the MDCT coefficients so that the IMDCT and IMDST using FFT can be applied. As a result, the audio decoding apparatus incorporating the orthogonal transform apparatus can reduce the amount of computation needed to transform the MDCT coefficients of the residual signal into the QMF coefficients.

The present invention is not limited to the above specific embodiment. For example, in the butterfly computation unit 22 in the orthogonal transform unit 16 according to the above embodiment, the butterfly inverse cosine transform unit 31 and the butterfly inverse sine transform unit 32 each contains an interchanging unit and an inverting unit. However, the processing that the interchanging unit and the inverting unit perform is the same for both the butterfly IMDCT and the butterfly IMDST. In view of this, according to a modified example, the MDCT coefficients may first be processed by the interchanging unit and the inverting unit, and then the processed MDCT coefficients may be input to both the butterfly inverse cosine transform unit 31 and the butterfly inverse sine transform unit 32.

Figure 15:
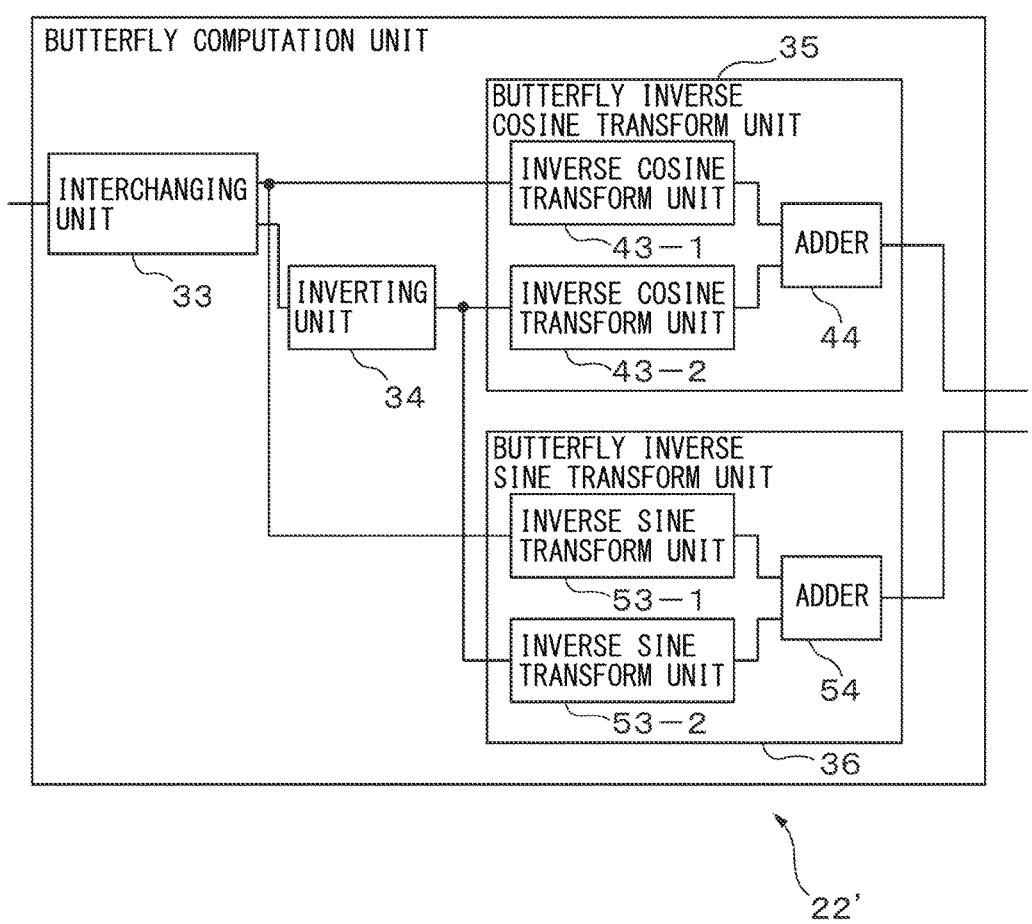
FIG. 15 is a block diagram of a butterfly computation unit according to a modified example.

FIG. 15 is a block diagram of a butterfly computation unit 22' that implements such a modified example. In this modified example, the butterfly computation unit 22' includes an interchanging unit 33, an inverting unit 34, a butterfly inverse cosine transform unit 35, and a butterfly inverse sine transform unit 36. The butterfly inverse cosine transform unit 35 and the butterfly inverse sine transform unit 36 differ from the butterfly inverse cosine transform unit 31 and the butterfly inverse sine transform unit 32 in the above embodiment by the omission of the interchanging unit and the inverting unit. Instead, the interchanging unit 33 provided separately from both the butterfly inverse cosine transform unit 35 and the butterfly inverse sine transform unit 36 interchanges the MDCT coefficients contained in the first half of the computation interval with the MDCT coefficients contained in the second half thereof, and the inverting unit 34 inverts the sign of the MDCT coefficients contained in the second half after the interchange. Then, the MDCT coefficients contained in the first half after the interchange are supplied from the interchanging unit 33 to both the butterfly inverse cosine transform unit 35 and the butterfly inverse sine transform unit 36. On the other hand, the sign-inverted MDCT coefficients contained in the second half after the interchange are supplied from the inverting unit 34 to both the butterfly inverse cosine transform unit 35 and the butterfly inverse sine transform unit 36. In this modified example, since only one interchanging unit 33 and only one inverting unit 34 need be provided, the amount of circuitry can be reduced compared with the above embodiment.

According to a further modified example, in the butterfly computation unit 22' of FIG. 15, only one inverse cosine transform unit may be provided in the butterfly inverse cosine transform unit 35. In this case, the inverse cosine transform unit performs the IMDCT on an interval twice as long, i.e., the calculation of the entire right-hand side of the equation (8). In this case, however, the inverse cosine transform unit needs to compute a number, 2N, of coefficients from a number, 2N, of MDCT coefficients, as in the case of the butterfly IMDCT. Similarly, only one inverse sine transform unit may be provided in the butterfly inverse sine transform unit 36, and the inverse sine transform unit may perform the IMDST on an interval twice as long. In this case, the adders are omitted.

A computer program for causing a computer to implement the functions of the various units constituting the orthogonal transform apparatus according to the above embodiment or its modified example may be distributed in the form stored in a semiconductor memory or in the form recorded on a recording medium such as a magnetic recording medium or an optical recording medium. Likewise, a computer program for causing a computer to implement the functions of the various units constituting the audio decoding apparatus according to the above embodiment or its modified example may be distributed in the form stored in a semiconductor memory or in the form recorded on a recording medium such as a magnetic recording medium or an optical recording medium. The term "recording medium" used here does not include a carrier wave.

Figure 16:
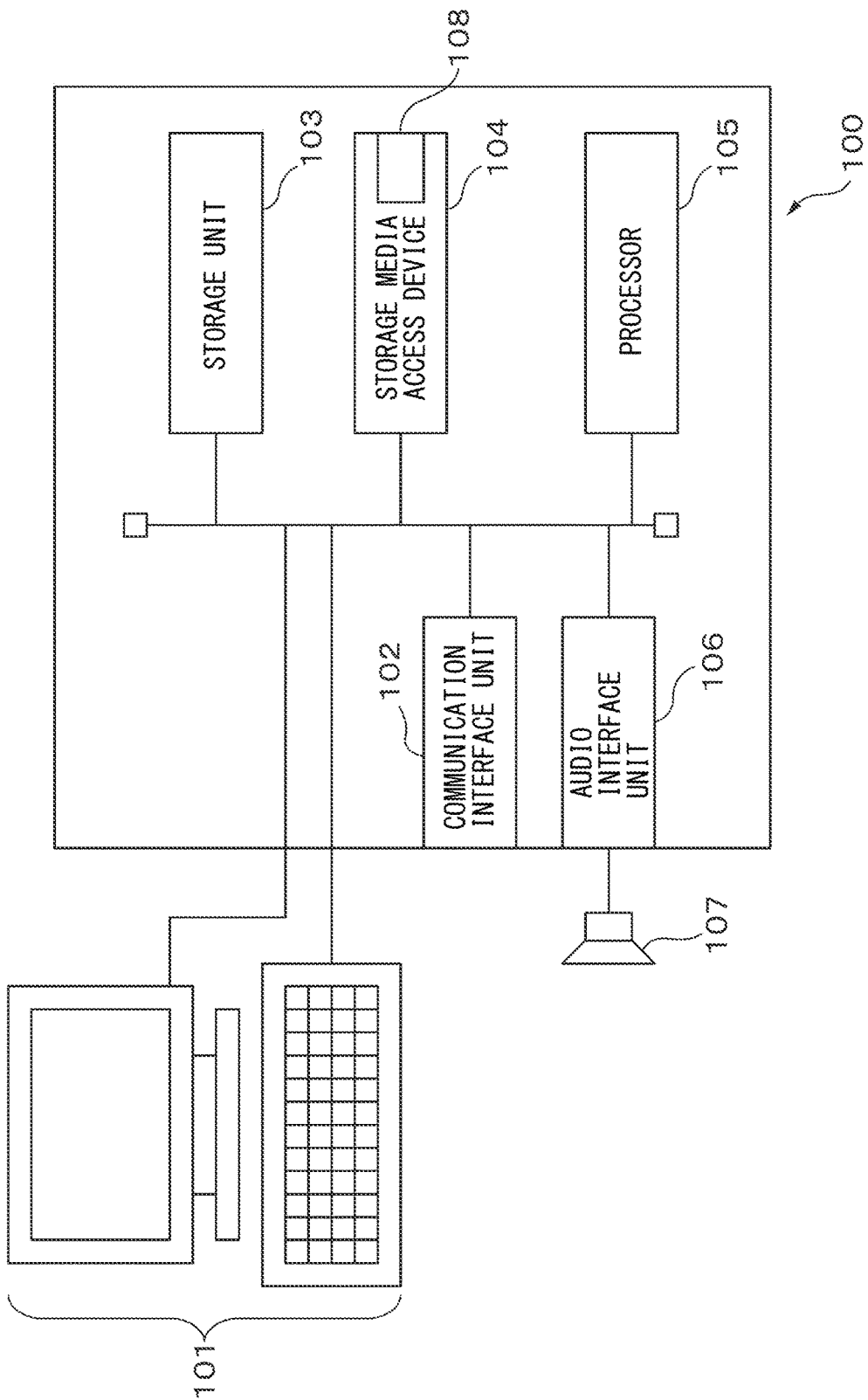
FIG. 16 is a diagram illustrating the configuration of a computer that operates as the audio decoding apparatus by executing a computer program for implementing the functions of the various units constituting the audio decoding apparatus according to the above embodiment and its modified example.

FIG. 16 is a diagram illustrating the configuration of a computer that operates as the audio decoding apparatus by executing a computer program for implementing the functions of the various units constituting the audio decoding apparatus according to the above embodiment or its modified example.

The computer 100 includes a user interface unit 101, a communication interface unit 102, a storage unit 103, a storage media access device 104, a processor 105, and an audio interface unit 106. The processor 105 is connected to the user interface unit 101, communication interface unit 102, storage unit 103, storage media access device 104, and audio interface unit 106, for example, via a bus.

The user interface unit 101 includes, for example, an input device such as a keyboard and a mouse, and a display device such as a liquid crystal display. Alternatively, the user interface unit 101 may include a device, such as a touch panel display, into which an input device and a display device are integrated. The user interface unit 101 generates, for example, in response to a user operation, an operation signal for selecting audio data to be decoded, and supplies the operation signal to the processor 105.

The communication interface unit 102 may include a communication interface for connecting the computer 100 to an audio data encoding apparatus, for example, a video camera, and a control circuit for the communication interface. Such a communication interface may be, for example, a Universal Serial Bus (USB) interface.

Further, the communication interface unit 102 may include a communication interface for connecting to a communication network conforming to a communication standard such as the Ethernet (registered trademark), and a control circuit for the communication interface.

In the latter case, the communication interface unit 102 receives encoded audio data to be decoded from another apparatus connected to the communication network, and passes the received data to the processor 105.

The storage unit 103 includes, for example, a readable/writable semiconductor memory and a read-only semiconductor memory. The storage unit 103 stores a computer program for implementing the audio decoding process to be executed on the processor 105, and also stores the data generated as a result of or during the execution of the program.

The storage media access device 104 is a device that accesses a storage medium 108 such as a magnetic disk, a semiconductor memory card, or an optical storage medium. The storage media access device 104 accesses the storage medium 108 to read out, for example, the computer program for audio decoding to be executed on the processor 105, and passes the readout computer program to the processor 105.

The processor 105 decodes the encoded audio data by executing the audio decoding computer program according to the above embodiment or its modified example. The processor 105 outputs the decoded audio data to a speaker 107 via the audio interface unit 106.

The orthogonal transform apparatus according to the above embodiment or its modified example may be adapted for use in applications other than the decoding of the audio signals encoded in accordance with the MPEG Surround System. The orthogonal transform apparatus according to the above embodiment or its modified example can be applied to various kinds of apparatus that need to transform MDCT coefficients into QMF coefficients.

Further, the audio decoding apparatus according to the above embodiment or its modified example can be incorporated in various kinds of apparatus, such as a computer, a video signal recording/reproduction machine, etc., used to reproduce encoded audio signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. An audio decoding apparatus for decoding a multichannel audio signal from a data stream containing a main signal code into which a main signal representing a main component of each channel obtained by downmixing each channel signal of the multichannel audio signal is encoded, a residual signal code into which coefficients obtained by performing a modified discrete cosine transform on a residual signal orthogonal to the main signal are encoded, and a spatial information code into which spatial information representing the degree of interchannel similarity and interchannel intensity difference is encoded, the audio decoding apparatus comprising:

a processor configured to:

demultiplex the main signal code, the residual signal code, and the spatial information code from the data stream;

reconstruct the main signal in a time domain by decoding the main signal code;

transform the main signal in the time domain into quadrature mirror filter coefficients in a time-frequency domain by applying quadrature mirror filtering to the main signal;

reconstruct the spatial information by decoding the spatial information code;

reconstruct the modified discrete cosine transform coefficients of the residual signal by decoding the residual signal code;

transform, for each of a plurality of prescribed intervals generated so as to overlap each other by one half by dividing an entire frequency band, the modified discrete cosine transform coefficients of the residual signal contained in the prescribed interval into quadrature mirror filter coefficients in the time-frequency domain;

compute quadrature mirror filter coefficients for each channel of the audio signal by upmixing the quadrature mirror filter coefficients of the main signal and the quadrature mirror filter coefficients of the residual signal by using the spatial information; and reconstruct each channel signal of the audio signal by applying inverse quadrature mirror filtering to the quadrature mirror filter coefficients of each channel, and wherein the transforming the modified discrete cosine transform coefficients of the residual signal contained in the prescribed interval into quadrature mirror filter coefficients in the time-frequency domain comprises:

interchanging the modified discrete cosine transform coefficients contained in a first half of the prescribed interval with the modified discrete cosine transform coefficients contained in a second half of the prescribed interval;

inverting the sign of the modified discrete cosine transform coefficients contained in the second half of the prescribed interval after the interchange;

computing real components of the quadrature mirror filter coefficients of the residual signal by performing an inverse modified discrete cosine transform using a fast Fourier transform to both of the modified discrete cosine transform coefficients contained in the first half of the prescribed interval after the interchange and the sign-inverted modified discrete cosine transform coefficients contained in the second half of the prescribed interval after the interchange;

computing imaginary components of the quadrature mirror filter coefficients of the residual signal by performing an inverse modified discrete sine transform using a fast Fourier transform to both of the modified discrete cosine transform coefficients contained in the first half of the prescribed interval after the interchange and the sign-inverted modified discrete cosine transform coefficients contained in the second half of the prescribed interval after the interchange; and obtaining the quadrature mirror filter coefficients of the residual signal by combining the real components of the quadrature mirror filter coefficients of the residual signal with the imaginary components of the quadrature mirror filter coefficients of the residual signal.

2. The audio decoding apparatus according to claim 1, wherein computing the real components of the quadrature mirror filter coefficients comprises:

computing first coefficients by performing the inverse modified discrete cosine transform using the fast Fourier transform to the modified discrete cosine transform coefficients contained in the first half of the prescribed interval after the interchange;

computing second coefficients by performing the inverse modified discrete cosine transform using the fast Fourier transform to the sign-inverted modified discrete cosine transform coefficients contained in the second half of the prescribed interval after the interchange; and obtaining the real components of the quadrature mirror filter coefficients by combining the first and second coefficients.

3. The audio decoding apparatus according to claim 1, wherein computing the imaginary components of the quadrature mirror filter coefficients comprises:

computing first coefficients by performing the inverse modified discrete sine transform using the fast Fourier transform to the modified discrete cosine transform coefficients contained in the first half of the prescribed interval after the interchange;

computing second coefficients by performing the inverse modified discrete sine transform using the fast Fourier transform to the sign-inverted modified discrete cosine transform coefficients contained in the second half of the prescribed interval after the interchange; and obtaining the imaginary components of the quadrature mirror filter coefficients by combining the first and second coefficients.

* * * * *